US009666436B2

(12) United States Patent
Xu et al.

(10) Patent No.: US 9,666,436 B2
(45) **Date of Patent: *May 30, 2017**

(54) ION IMPLANTATION METHODS

(71) Applicant: Rohm and Haas Electronic Materials LLC, Marlborough, MA (US)

(72) Inventors: Cheng-Bai Xu, Southborough, MA (US); Cheng Han Wu, Marlborough, MA (US); Dong Won Chung, Gyeonggi-do (KR); Yoshihiro Yamamoto, Niigata (JP)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/145,726

(22) Filed: Dec. 31, 2013

(65) Prior Publication Data

US 2014/0187027 A1 Jul. 3, 2014

Related U.S. Application Data

(60) Provisional application No. 61/748,058, filed on Dec. 31, 2012.

(51) Int. Cl.
*H01L 21/425* (2006.01)
*H01L 21/266* (2006.01)
(Continued)

(52) U.S. Cl.
CPC ........ *H01L 21/266* (2013.01); *H01L 21/0206* (2013.01); *H01L 21/0273* (2013.01); *H01L 21/02118* (2013.01); *H01L 21/31058* (2013.01)

(58) Field of Classification Search
CPC .......................... H01L 21/266; H01L 21/0273
(Continued)

(56) References Cited

U.S. PATENT DOCUMENTS 4,163,702 A * 8/1979 Rickert, Jr. .................. 204/488
5,272,026 A * 12/1993 Roland ................ G03F 7/0226 430/165

(Continued)

FOREIGN PATENT DOCUMENTS

JP 2002006512 A 1/2002
JP 2002299202 A 10/2002
JP 4329216 B2 9/2009

OTHER PUBLICATIONS

Co-Pending U.S. Appl. No. 14/145,674, filed Dec. 31, 2013.

(Continued)

*Primary Examiner* — Xinning Niu
*Assistant Examiner* — Vu A Vu
(74) *Attorney, Agent, or Firm* — Jonathan D. Baskin

(57) ABSTRACT

Provided are methods of forming an ion implanted region in a semiconductor device. The methods comprise: (a) providing a semiconductor substrate having a plurality of regions to be ion implanted; (b) forming a photoresist pattern on the semiconductor substrate, wherein the photoresist pattern is formed from a chemically amplified photoresist composition comprising a matrix polymer having acid labile groups, a photoacid generator and a solvent; (c) coating a descumming composition over the photoresist pattern, wherein the descumming composition comprises: a matrix polymer; a free acid; and a solvent; (d) heating the coated semiconductor substrate; (e) contacting the coated semiconductor substrate with a rinsing agent to remove residual descumming composition and scum from the substrate; and (f) ion implanting the plurality of regions of the semiconductor substrate using the photoresist pattern as an implant mask. The methods find particular applicability in the manufacture of semiconductor devices.

18 Claims, 1 Drawing Sheet

(51) Int. Cl.

| | |
|---|---|
| *H01L 21/3105* | (2006.01) |
| *H01L 21/02* | (2006.01) |
| *H01L 21/027* | (2006.01) |

(58) Field of Classification Search

USPC ..................... 438/530, 745; 257/368; 430/18

See application file for complete search history.

(56) References Cited

U.S. PATENT DOCUMENTS

| | | | |
|---|---|---|---|
| 6,180,320 | B1 | 1/2001 | Saito et al. |
| 6,274,289 | B1 | 8/2001 | Subramanian et al. |
| 6,492,075 | B1 | 12/2002 | Templeton et al. |
| 7,338,750 | B2 | 3/2008 | Kozawa et al. |
| 7,862,982 | B2 * | 1/2011 | Burns ....................... G03F 7/40 430/270.1 |
| 8,067,148 | B2 | 11/2011 | Endou et al. |
| 8,252,673 | B2 | 8/2012 | Afzali-Ardakani et al. |
| 8,623,739 | B2 | 1/2014 | Lee et al. |
| 9,209,028 | B2 * | 12/2015 | Xu ........................ H01L 21/266 |
| 2001/0036748 | A1 * | 11/2001 | Rutter, Jr. ........... H01L 21/0274 438/745 |
| 2002/0115883 | A1 * | 8/2002 | Ogata ................... C07C 69/653 560/219 |
| 2006/0263728 | A1 | 11/2006 | Shinbori et al. |
| 2007/0152305 | A1 | 7/2007 | Kim |
| 2009/0236665 | A1 * | 9/2009 | Lin ..................... H01L 29/7836 257/368 |
| 2010/0183978 | A1 * | 7/2010 | Yoshidome ........... G03F 7/0035 430/270.1 |
| 2011/0151653 | A1 | 6/2011 | Afzali-Ardakani |
| 2012/0028434 | A1 | 2/2012 | Lee et al. |
| 2013/0171574 | A1 * | 7/2013 | Xu ................................ 430/325 |
| 2014/0186772 | A1 | 7/2014 | Pohlers et al. |

OTHER PUBLICATIONS

Search report for corresponding Chinese Application No. 201310757503.9, Feb. 19, 2016.

Search report for corresponding Taiwanese Application No. 102149240 dated Dec. 29, 2015.

* cited by examiner

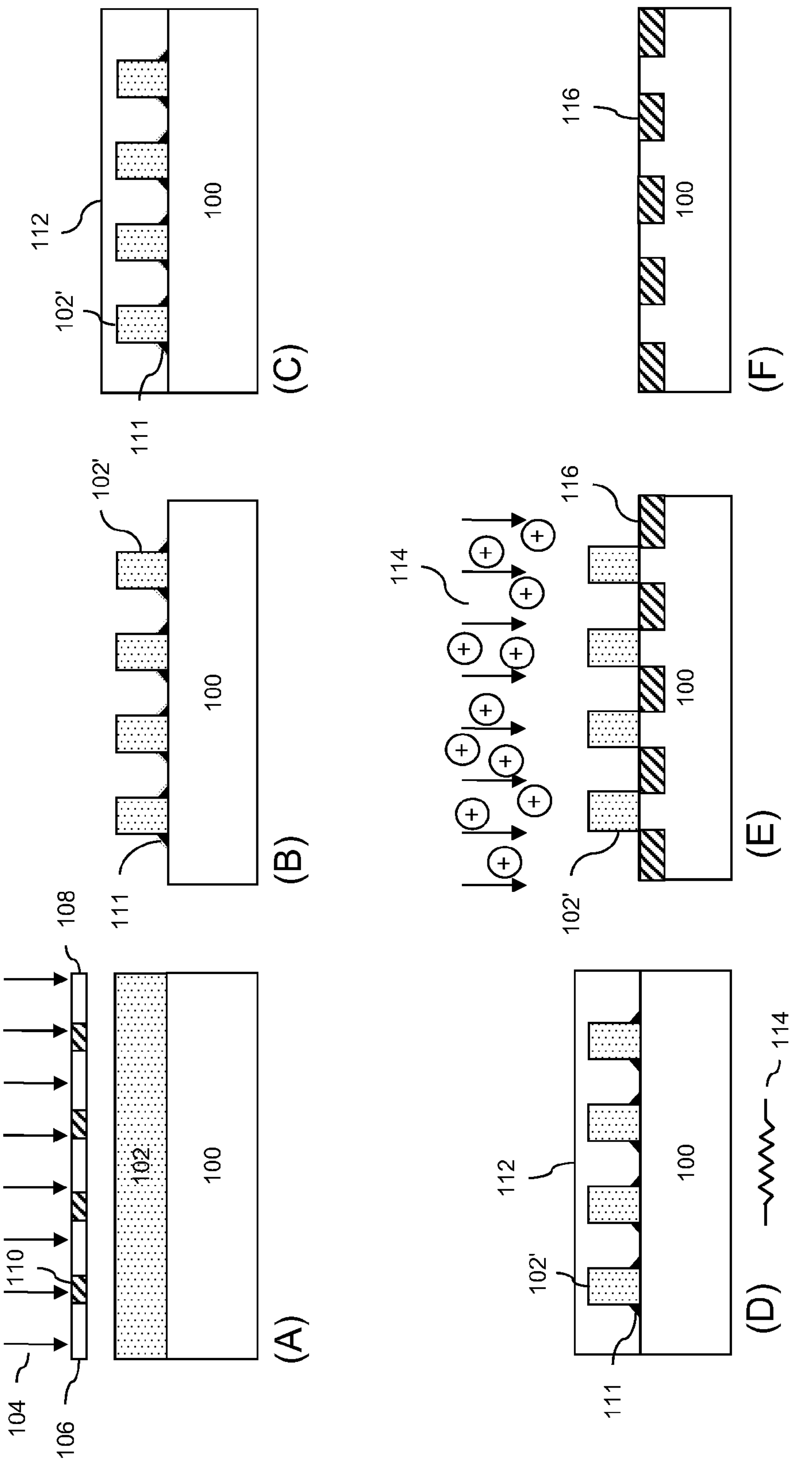
104
106
108
110
102
100
(A)
111
102'
100
(B)
111
102'
112
100
(C)
111
102'
112
100
114
(D)
102'
114
116
100
(E)
116
100
(F)

ION IMPLANTATION METHODS

This application claims the benefit of priority under 35 U.S.C. §119(e) to U.S. Provisional Application No. 61/748,058, filed Dec. 31, 2012, the entire contents of which application are incorporated herein by reference.

BACKGROUND

The invention relates generally to the manufacture of electronic devices. More specifically, this invention relates to methods of forming ion implanted regions in a semiconductor device.

In the semiconductor manufacturing industry, ion implantation is conventionally used for introducing impurities (or dopants) of a desired conductivity into semiconductor substrates such as silicon wafers. Commonly used impurities include boron (p-type), arsenic (n-type) and phosphorus (n-type). When implanted into a semiconductor, the dopant atoms create charge carriers after annealing. Holes are created for p-type dopants and electrons for n-type dopants, thereby allowing for modification of conductivity of the semiconductor material. The process is thereby used to form and impart desired characteristics to electronic devices such as MOSFETs.

The ion implantation process involves generation of an ion beam containing the dopant in ionized form from a source, typically in gas or solid form, which is directed to the semiconductor substrate surface. To selectively introduce the impurity atoms into predefined regions of the substrate, a photoresist mask is typically formed over the substrate surface prior to ion implantation. The mask is formed by coating the substrate with a photoresist layer which is then exposed to activating radiation through a patterned photomask and developed to form a resist pattern. The resist pattern includes openings exposing the underlying substrate, the openings corresponding to regions of the semiconductor substrate to be implanted and regions of the substrate underlying the resist mask being protected from implantation. Following implantation, the resist mask is stripped from the substrate and the substrate is annealed.

As photolithography technology approaches its resolution limits, the printing of fine geometries on the substrate surface is a challenge. As a result of the extremely fine geometries required in the current generation of semiconductor devices, even small variations in the ion implantation process can adversely affect electrical properties of the formed devices. One factor detrimental to the ion implantation process is the presence of photoresist residue (scum) on regions of the substrate to be implanted following patterning of the implant mask. The presence of such resist scum can drastically impact device yield.

US 2011/10174774 A1 discloses a method of descumming a patterned photoresist. The method includes providing a material layer to be etched covered by a patterned photoresist, performing a descumming process with a nitrogen plasma to trim the edge of the patterned photoresist, and etching the material layer using the descumming patterned photoresist as a mask. The use of a plasma descumming process such as described in this document is undesirable for use with an ion implantation mask, for example, because of the complexity of the plasma etching process and plasma-induced damage to the underlying surface.

There is a continuing need in the art for improved ion implantation and photolithographic methods which minimize or avoid problems associated with the state of the art.

SUMMARY OF THE INVENTION

In accordance with a first aspect of the invention, methods of forming an ion implanted region in a semiconductor device are provided. The methods comprise: (a) providing a semiconductor substrate having a plurality of regions to be ion implanted; (b) forming a photoresist pattern on the semiconductor substrate, wherein the photoresist pattern is formed from a chemically amplified photoresist composition comprising a matrix polymer having acid labile groups, a photoacid generator and a solvent; (c) coating a descumming composition over the photoresist pattern, wherein the descumming composition comprises: a matrix polymer; a free acid; and a solvent; (d) heating the coated semiconductor substrate; (e) contacting the coated semiconductor substrate with a rinsing solution to remove residual descumming composition and scum from the substrate; and (f) ion implanting the plurality of regions of the semiconductor substrate using the photoresist pattern as an implant mask.

In accordance with a further aspect of the invention, provided are electronic devices formed by the methods described herein.

DESCRIPTION OF THE DRAWINGS

The present invention will be described with reference to the following drawing, in which like reference numerals denote like features, and in which:

FIG. 1A-F illustrates a process flow for forming an ion implanted region in a semiconductor device in accordance with the invention.

DETAILED DESCRIPTION

Photoresist descumming compositions useful in the methods of the invention include a matrix polymer, a free acid, and a solvent, and can include optional additional components. When coated over a semiconductor substrate having a photoresist implant mask, the descumming compositions can advantageously minimize or eliminate the presence of scum on the surface of the pre-ion implanted substrate. As a result, ion implantion dopant profiles are not adversely impacted allowing for the formation of devices having desired electrical properties.

The matrix polymer allows for the compositions to be coated over the photoresist pattern in the form of a layer having a desired thickness. This will help to ensure the presence of a sufficient content of acid for interaction with scum on the photoresist patterned surface. The matrix polymer should have good solubility in the descumming composition rinsing agent used in the process. For example, the matrix polymer can be soluble in an aqueous alkaline rinsing agent, preferably aqueous quaternary ammonium hydroxide solutions such as aqueous tetramethylammonium hydroxide, or in water. To minimize residue defects originated from the descumming materials, the dissolution rate of a dried layer of the descumming composition should be greater than that of the photoresist pattern in the descumming composition rinsing agent. The matrix polymer typically exhibits a dissolution rate of 100 Å/second or higher in the rinsing agent, preferably 1000 Å/second or higher. The matrix polymer is soluble in the solvent of the descumming composition. The matrix polymer can be chosen, for example, from polyvinyl alcohols, polyacrylic acids, polyvinyl pyrrolidones, polyvinyl amines, polyvinyl acetals, poly(meth)acrylic acid and combinations thereof. Preferably, the polymer contains one or more functional group chosen from, —COOH, $-SO_3H$, SiOH, hydroxyl styrene, hydroxyl naphthalene, sulfonamide, hexafluoroisopropyl alcohol, anhydrates, lactones, esters, ethers, malamide, allylamine, pyrrolidones and combinations thereof.

The content of the matrix polymer in the descumming composition will depend, for example, on the target thickness of the layer, with a higher polymer content being used for thicker layers. The matrix polymer is typically present in the descumming compositions in an amount of from 80 to 99 wt %, more typically from 90 to 99 wt %, based on total solids of the descumming composition. The weight average molecular weight of the polymer is typically less than 400,000, preferably from 2000 to 50,000, more preferably from 3000 to 10,000.

Polymers useful in the descumming compositions can be homopolymers or can be copolymers having a plurality of distinct repeat units, for example, two, three or four distinct repeat units. The descumming compositions include one or more polymer. Suitable polymers and monomers for use in the descumming compositions are commercially available and/or can readily be made by persons skilled in the art.

The descumming compositions further include one or more free acid. In the case of photoresist scum formed from a resist based on deprotection reaction, the free acid with heat can cleave the bond of acid labile groups in the scum. Suitable acids include both aromatic and non-aromatic acids. Preferably, the acid is a strong acid such as a sulfonic acid. Suitable non-aromatic acids can have at least one fluorine substituent at the alpha position of the acid group.

Preferable acids for use in the descumming compositions include aliphatic and aromatic structures. Aromatic acids preferably comprise a phenyl, biphenyl, naphthyl, anthracenyl, thiophene or furan group. Suitable acids include those of the following formulae (I) to (VII):

$$R^0ASO_3H \quad (I)$$

wherein: $R^0$ is a linear, branched or cyclic alkyl group having from 1 to 30 carbon atoms, preferably from 1 to 15 carbon atoms, optionally substituted, for example, with a fluorine atom or hydroxy group; and A is a single bond, an ether group, a thioether group, a carbonyl group, an ester group, an amido group, a sulfonamido group, a urethane group, a urea group, an alkylene group optionally substituted, for example, with a fluorine atom or hydroxy group, or a combination thereof;

(II)

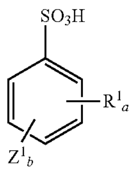

wherein: $R^1$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^1$ independently represents a group chosen from carboxyl, hydroxy, nitro, cyano, C1 to C5 alkoxy, formyl and sulfonic acid; a and b are independently an integer from 0 to 5; and a+b is 5 or less;

(III)

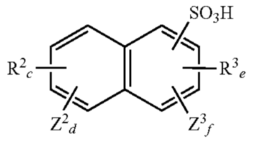

wherein: $R^2$ and $R^3$ each independently represents a substituted or unsubstituted C1-C20 alkyl group, a substituted or unsubstituted C5-C16 aryl group or a combination thereof, optionally containing one or more group chosen from carbonyl, carbonyloxy, sulfonamido, ether, thioether, a substituted or unsubstituted alkylene group, or a combination thereof; $Z^2$ and $Z^3$ each independently represents a group chosen from carboxyl, hydroxy, nitro, cyano, C1 to C5 alkoxy, formyl and sulfonic acid; c and d are independently an integer from 0 to 4; c+d is 4 or less; e and f are independently an integer from 0 to 3; and e+f is 3 or less;

(IV)

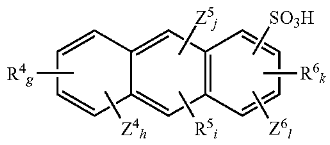

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 2; i+j is 2 or less; k and l are independently an integer from 0 to 3; and k+l is 3 or less;

(V)

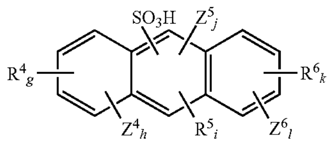

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 1; i+j is 1 or less; k and l are independently an integer from 0 to 4; and k+l is 4 or less;

(VI)

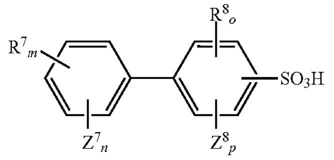

wherein: $R^7$ and $R^8$ each independently represents a substituted or unsubstituted C1-C20 alkyl group, a substituted or unsubstituted C5-C14 aryl group or a combination thereof, optionally containing one or more group chosen from carbonyl, carbonyloxy, sulfonamido, ether, thioether, a substituted or unsubstituted alkylene group, or a combination thereof; $Z^7$ and $Z^8$ each independently represents a group chosen from carboxyl, hydroxy, nitro, cyano, C1 to C5 alkoxy, formyl and sulfonic acid; m and n are independently an integer from 0 to 5; m+n is 5 or less; 0 and p are independently an integer from 0 to 4; and o+p is 4 or less; and (VII)

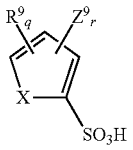

wherein: X is O or S; $R^9$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^9$ independently represents a group chosen from carboxyl, hydroxy, nitro, cyano, C1 to C5 alkoxy, formyl and sulfonic acid; q and r are independently an integer from 0 to 3; and q+r is 3 or less. For the foregoing structures, it should be clear that the $R^1$—$R^9$ groups can optionally form a fused structure together with their respective associated rings.

Suitable acids include, for example: $CF_3SO_3H$, $C_4F_9SO_3H$, $CH_3CH_2CF_2CF_2SO_3H$, $HOCH_2CH_2CF_2CF_2SO_3H$,

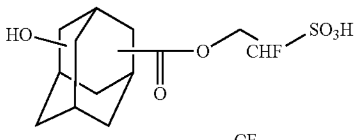

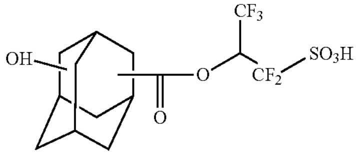

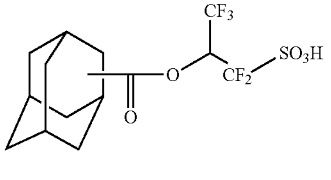

-continued

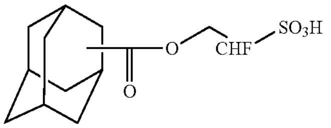

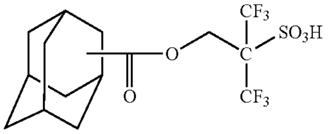

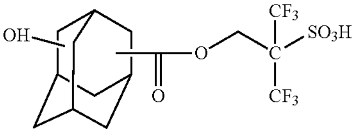

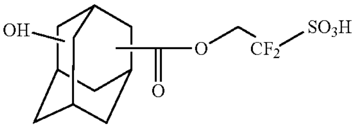

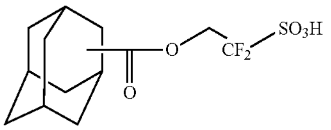

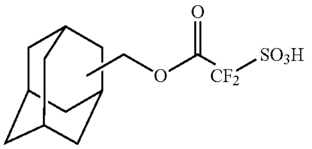

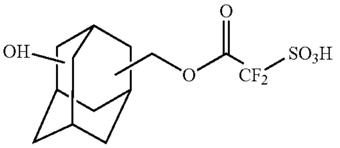

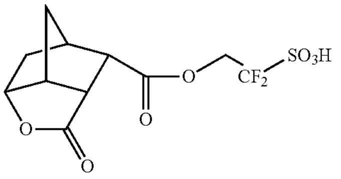

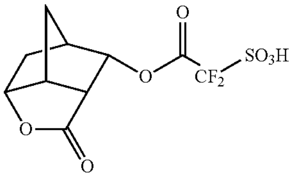

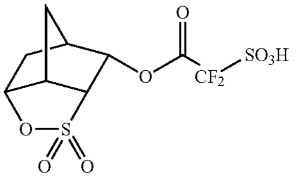

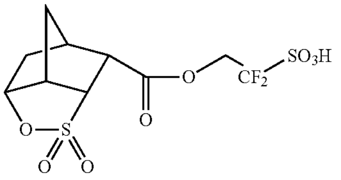

-continued
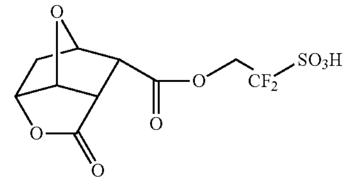
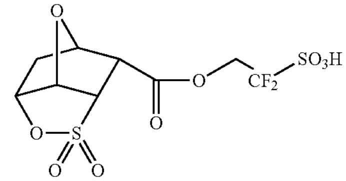
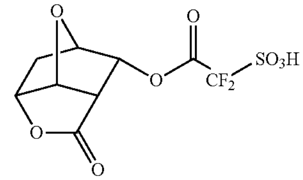
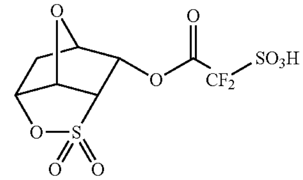
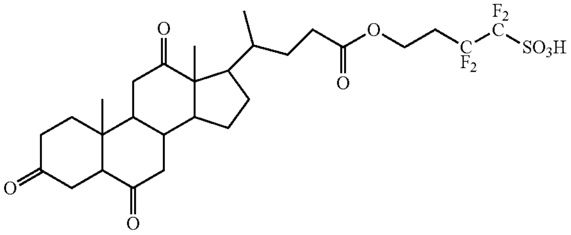
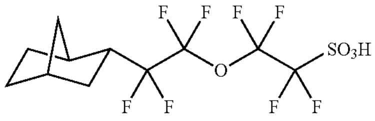
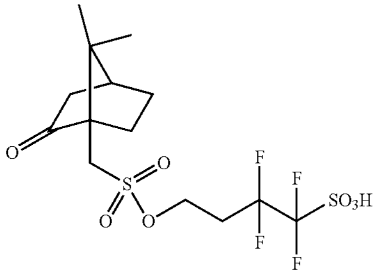
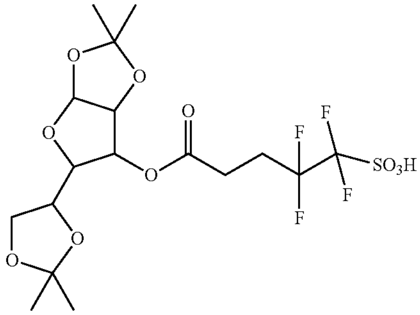
-continued
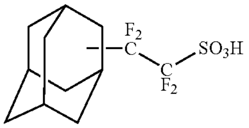
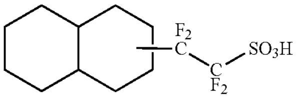
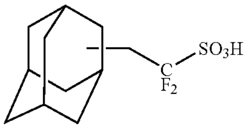
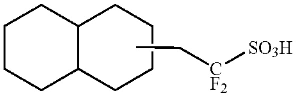
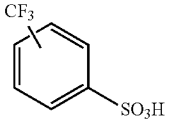
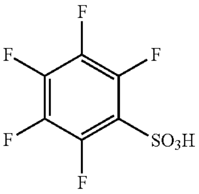
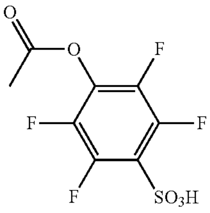
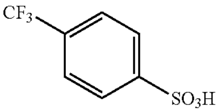
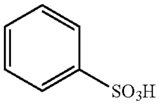
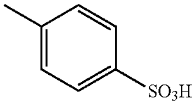
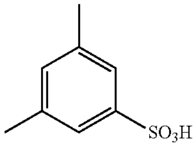
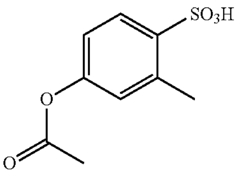
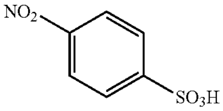
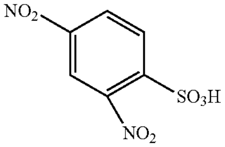
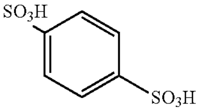
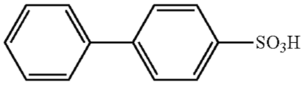
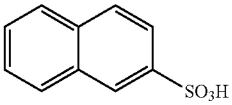
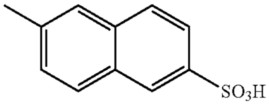
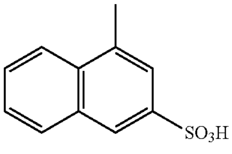
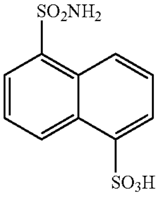

-continued
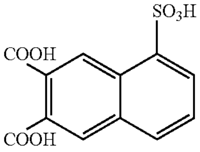
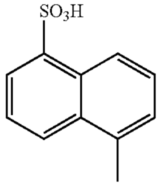
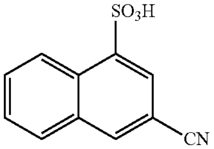
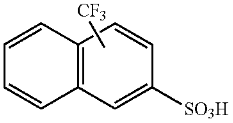
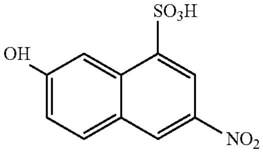
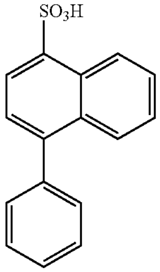
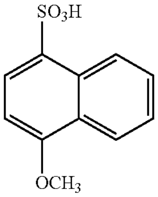
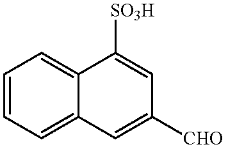
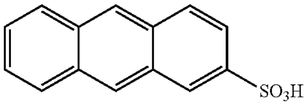
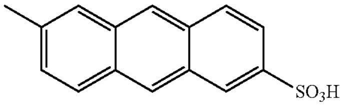
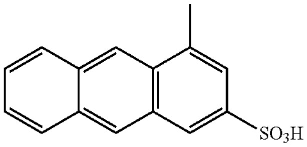
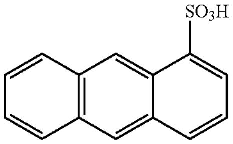
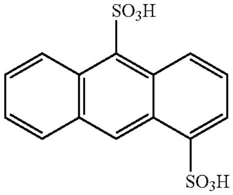
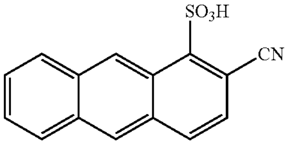
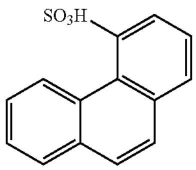
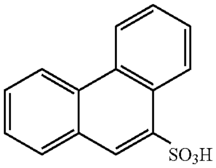
-continued
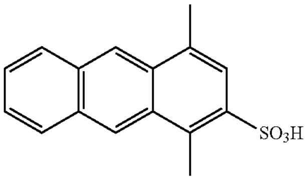
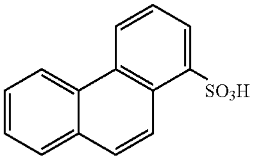
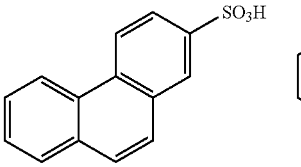
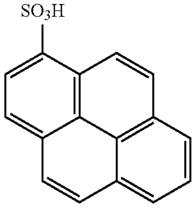
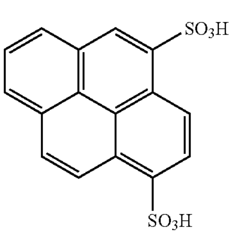
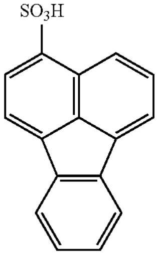
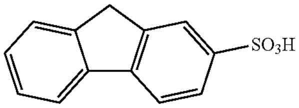
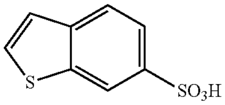
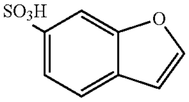
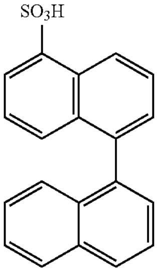
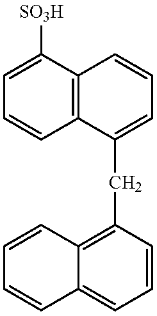
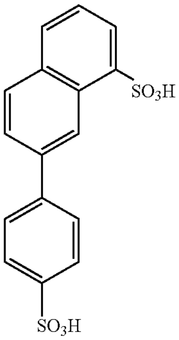
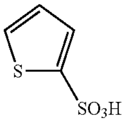
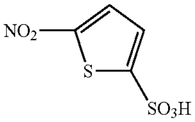

-continued

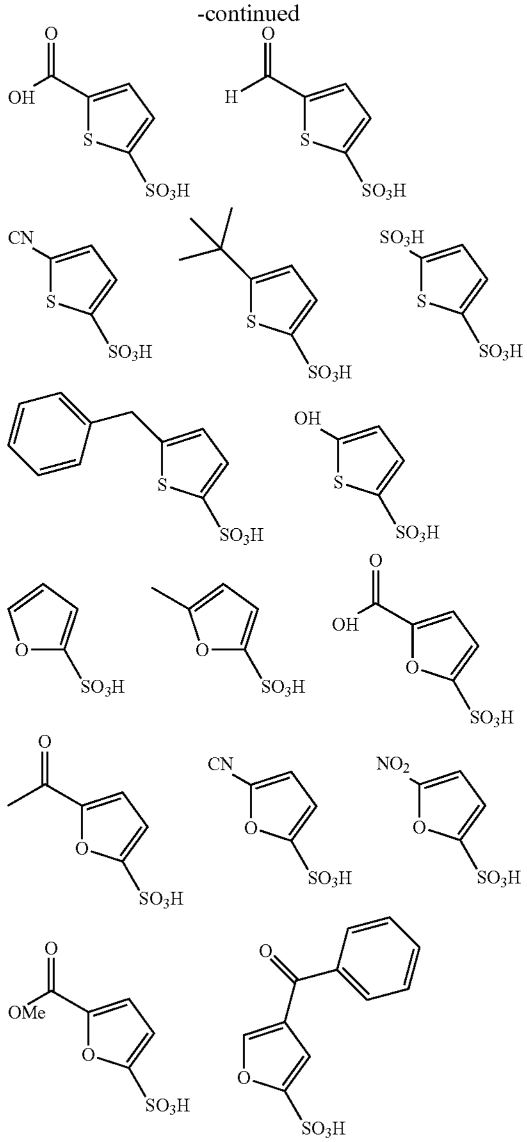

The content of the acid in the descumming composition is typically from 0.1 to 20 wt % based on the total solids of the descumming composition.

The descumming compositions further include a solvent or solvent mixture. Suitable solvent materials to formulate and cast the descumming compositions exhibit very good solubility characteristics with respect to the non-solvent components of the descumming composition, but do not appreciably dissolve the underlying photoresist pattern so as to minimize intermixing. The solvent is typically chosen from water, aqueous solutions, organic solvents and mixtures thereof. Suitable organic solvents for the descumming composition include, for example: alcohols such as straight, branched or cyclic $C_4$-$C_9$ monohydric alcohol such as 1-butanol, 2-butanol, isobutyl alcohol, tert-butyl alcohol, 2-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; alkyl esters such as alkyl acetates such as n-butyl acetate, propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; ethers such as isopentyl ether and dipropylene glycol monomethyl ether; and mixtures containing one or more of these solvents. Of these organic solvents, alcohols, aliphatic hydrocarbons and ethers are preferred. The solvent component of the descumming composition is typically present in an amount of from 90 to 99 wt % based on the descumming composition.

The descumming compositions may include optional additives and are preferably free of cross-linking agents as such materials can result in a dimensional increase of the resist pattern and may interfere with scum removal. As an optional additive, the descumming compositions can include a component that reacts with scum on the substrate, rendering the scum soluble in an organic solvent rinsing agent. This optional component preferably contains functional groups chosen from —OH, —NH, —SH, ketones, aldehydes, —SiX wherein X is a halogen, vinyl ethers and combinations thereof. Without wishing to be bound by any particular theory, it is believed that the component diffuses into the scum and reacts with carboxylic acid groups of the scum. This reaction results in a polarity change of the surface, rendering the surface soluble in the organic solvent. This component can be useful, for example, where the photoresist pattern is formed by negative tone development (NTD) wherein the pattern is composed of unexposed portions of the photoresist comprising acid-labile groups. Such component if used is typically present in an amount of from 0.1 to 10 wt % based on total solids of the descumming composition.

The descumming composition can further include a surfactant. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such surfactant and other optional additives if used are typically present in the composition in minor amounts such as from 0.01 to 10 wt % based on total solids of the descumming composition.

The descumming compositions can be prepared following known procedures. For example, the compositions can be prepared by dissolving solid components of the composition in the solvent components. The desired total solids content of the compositions will depend on factors such as the desired final layer thickness. Preferably, the solids content of the descumming compositions is from 1 to 10 wt %, more preferably from 1 to 5 wt %, based on the total weight of the composition.

Processes in accordance with the invention will now be described with reference to FIG. 1A-F, which illustrates an exemplary process flow for forming an ion implanted region in a semiconductor device using a photoresist descumming composition as described herein. FIG. 1A depicts in cross-section a semiconductor substrate 100. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. Layers forming part of the substrate may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, or electroplating.

Ion implanted regions are typically formed a number of times through the semiconductor manufacturing process. The regions to be ion implanted may be present in the base substrate material itself or in a layer formed over the base substrate material. Typical ion implanted regions include, for example, wells, source/drain regions, transistor channel regions, lightly doped drains (LDDs), device isolation regions, contact holes implant regions and the like.

A photoresist layer 102 formed from a chemically amplified photosensitive composition comprising a matrix polymer having acid labile groups is coated over the substrate. The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 102 is from about 500 to 3000 Å.

The photoresist layer 102 can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

It may be desired to dispose over the substrate an antireflective coating above or beneath the photoresist layer to be coated to reduce reflection of incident radiation during photoresist exposure. Such coatings can improve depth-of-focus, exposure latitude, linewidth uniformity and CD control. Because integrity of the ion implantation process depends to a large extent on the quality of the surface being implanted, it is preferable that the implanted surface be free of damage that can occur when an inorganic bottom antireflective coating (BARC) material is plasma-etched following photoresist development. As such, it is preferable to use an organic developable BARC (DBARC) layer beneath the photoresist pattern and/or a top antireflective coating (TARC) layer over the photoresist pattern when an antireflective material is desired. These materials are advantageous in that they can be removed from the substrate without exposing the regions of the substrate to be ion implanted to plasma etch-induced damage during etching. Such materials can be removed from the substrate at the time of developing the photoresist layer. Because some DBARC materials are photosensitive, such a DBARC layer underlying the photoresist layer can be exposed and patterned at the same time as the photoresist layer using the same developer. Suitable DBARC materials and methods of use are known in the art and are described, for example, in U.S. Application Pub. No. US2011/0003250A1 and U.S. Pat. Nos. 7,824,837B2 and 8,088,548B2. Suitable TARC materials which are developer soluble and therefore removable at the time of resist development are also known in the art and described, for example, in U.S. Pat. No. 5,750,312.

If the photoresist layer 102 is to be exposed with an immersion lithography tool, for example a 193 nm immersion scanner, an immersion topcoat layer can be disposed over the photoresist layer. Use of such a topcoat layer can act as a barrier between the immersion fluid and underlying photoresist layer as well as providing antireflection properties. In this way, leaching of components of the photoresist composition into the immersion fluid, possibly resulting in contamination of the optical lens and change in the effective refractive index and transmission properties of the immersion fluid, can be minimized or avoided. Suitable topcoat compositions and their use are known in the art as described, for example, in U.S. Pat. Nos. 8,012,666B2 and 8,241,832B2.

The photoresist layer 102 is next exposed to activating radiation 104 through a first photomask 106 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions 108, 110 corresponding to regions of the resist layer to be exposed and unexposed, respectively, by the activating radiation. The activating radiation can, for example, have an exposure wavelength of sub-400 nm, sub-300 nm or sub-200 nm such as 193 nm or EUV wavelengths, or can take the form of e-beam radiation. The exposure energy is typically from about 10 to 80 mJ/cm$^2$, dependent upon the exposure tool and the components of the photosensitive composition.

Following exposure of the photoresist layer 102, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. A latent image defined by the boundary between polarity-switched and unswitched regions (corresponding to exposed and unexposed regions, respectively) is thereby formed. The feature geometries of the resist pattern are not limited and correspond to the geometries of the regions of the substrate to be implanted and not implanted.

The photoresist layer 102 is next developed to remove exposed regions of the layers, leaving unexposed regions forming a resist pattern 102' having a plurality of features as shown in FIG. 1B. The illustrated process is a positive tone development (PTD) method. The PTD developer is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH). Alternatively, negative tone development can be conducted by use of a suitable organic solvent developer. NTD results in the removal of unexposed regions of the photoresist layer, leaving behind exposed regions due to polarity reversal of those regions. Suitable NTD developers include, for example, a solvent chosen from ketones, esters, ethers, hydrocarbons, and mixtures thereof. Other suitable solvents include those used in the photoresist composition. The developer is preferably 2-heptanone or a butyl acetate such as n-butyl acetate.

Development of the photoresist layer can give rise to the presence of resist scum 111 on the substrate surface at the edges of resist pattern 102'. Resist scum 111 is undesirable as the dopant profile during ion implantation and resulting electrical properties of the formed devices can become altered from target values.

A layer 112 of a descumming composition as described herein is formed over the photoresist pattern 102' as shown in FIG. 1C. The descumming composition is typically applied to the substrate by spin-coating. The solids content of the descumming composition can be adjusted to provide a desired film thickness based upon the specific coating equipment utilized, the viscosity of the solution, the speed of the coating tool and the amount of time allowed for spinning. A typical thickness for the descumming composition layer 112 is from 200 to 1500 Å.

As shown in FIG. 1D, the substrate is next baked to remove solvent in the descumming composition layer 112, to allow the free acid to diffuse into the resist scum 111 and to give rise to the polarity-changing reaction in the resist scum. The bake can be conducted on a hotplate or in an oven 114, with a hotplate being typical. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical. While a single baking step is typical, multiple-step baking can be used.

The substrate is next contacted with a rinsing agent to remove residual descumming composition and resist scum from the substrate. The rinsing agent is typically water, an aqueous alkaline solution, or an organic solvent or solvent mixture, and may include additional optional components such as a surfactant as described above. Suitable aqueous alkaline solutions include, for example, a quaternary ammonium hydroxide solution, for example, a tetra-alkyl ammonium hydroxide solutions such as 0.26 Normality (N) (2.38 wt %) tetramethylammonium hydroxide (TMAH). Suitable organic solvents include, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Other suitable solvents include those used in the photoresist composition.

As shown in FIG. 1E, the substrate 100 having a scum-free surface is introduced into an ion implantation tool in which an ion beam 118 is generated and brought into contact with the substrate 100. The impurities are typically n-type (e.g., phosphorus or arsenic) or p-type (e.g., boron) and present in the ion beam as ionized species generated from a source, for example, a gas source such as phosphine, arsine or boron trifluoride, or a solid source such as solid arsenic or phosphorus. Impurity atoms from the ion beam are selectively introduced into the substrate 100 to form doped regions 120 in regions of the substrate not covered by the photoresist pattern 102'.

Following the ion implantation process, the photoresist pattern 102' is stripped from the surface of the substrate. Suitable techniques and chemistries for stripping the photoresist pattern 102' from the substrate are known in the art. The resist pattern can, for example, be removed by oxygen plasma with any remaining residue being removed in standard aqueous cleaning chemistries, for example, RCA (SC1+SC2) wet chemical cleaning. After removal of the resist pattern from the substrate surface, the substrate is typically subjected to thermal annealing treatment, for example, to repair damage in the substrate caused during the implant process and to activate the dopant atoms. Annealing techniques are known in the art and include heating the wafer at elevated temperature for a period of time to repair damage in the substrate caused by the implant process. Annealing is typically conducted in an inert gas atmosphere in a rapid thermal processor or a diffusion furnace. The annealing conditions will depend, for example, on the dopant material, the material into which the dopants are implanted and the desired dopant profile. The resulting structure is shown in FIG. 1F.

The following non-limiting examples are illustrative of the invention.

EXAMPLES

Photoresist Descumming Composition

Example 1

PDC-1

2.167 g of copolymer of n-butyl methacrylate/methacrylic acid (77/23 by wt.), 0.033 g p-Toluene Sulfonic Acid Monohydrate, and 97.8 g 4-methyl-2-pentanol were mixed together until all components were dissolved. The resulting mixture was filtered with a 0.2 micron Nylon filter.

Example 2

PDC-2

2.143 g of copolymer of n-butyl methacrylate/methacrylic acid (77/23 by wt.), 0.057 g Dodecylbenzene sulfonic acid, and 97.8 g 4-methyl-2-pentanol were mixed together until all components were dissolved. The resulting mixture was filtered with a 0.2 micron Nylon filter.

Example 3

PDC-3

2.160 g of copolymer of n-butyl methacrylate/methacrylic acid (77/23 by wt.), 0.04 g Camphor Sulfonic acid, and 97.8 g 4-methyl-2-pentanol were mixed together until all components were dissolved. The resulting mixture was filtered with a 0.2 micron Nylon filter.

Example 4

PDC-4

2.148 g of copolymer of n-butyl methacrylate/methacrylic acid (77/23 by wt.), 0.052 g Perfluorobutane sulfonic acid, and 97.8 g 4-methyl-2-pentanol were mixed together until all components were dissolved. The resulting mixture was filtered with a 0.2 micron Nylon filter.

Example 5

PDC-5

2.162 g of copolymer of n-butyl methacrylate/methacrylic acid (77/23 by wt.), 0.033 g p-Toluene Sulfonic sulfonic acid, 0.006 g PF 656 surfactant and 97.8 g 4-methyl-2-pentanol were mixed together until all components were dissolved. The resulting mixture was filtered with a 0.2 micron Nylon filter.

Example 6

PDC-6

2.162 g of copolymer of n-butyl methacrylate/methacrylic acid (77/23 by wt.), 0.033 g p-Toluene Sulfonic sulfonic acid, 0.006 g Surfynol 420 surfactant and were mixed together until all components were dissolved. The resulting mixture was filtered with a 0.2 micron Nylon filter.

Lithographic Processing

Example 7

Comparative

EPIC 2096 ArF photoresist (Rohm and Haas Electronic Materials LLC, Marlborough, Mass.) was spin-coated over organic bottom antireflective coating (BARC) bilayer (AR™137 20 nm/AR™26N 76 nm) coated 12-inch silicon wafers on a TEL Clean Track Lithius i+ (Tel Clean Track) and the wafers were softbaked (SB) at 120° C. for 60 seconds. A 30 nm thick OC™2000 topcoat layer (Rohm and Haas Electronic Materials) was applied over the photoresist layer on a TEL Clean Track and baked at 90° C. for 60 seconds. The coated wafers were exposed on an ASML ArF 1900i with NA=1.35, Dipole 35Y illumination (0.9/0.76 sigma), plus x polarization, and then post-exposure baked (PEB) at 95° C. for 60 seconds. The coated wafers were treated with a 0.26N (normal) aqueous TMAH solution for 12 seconds with a Tel Lithus GP nozzle to form 140 nm 1:1 trenches. Critical dimension (CD) measurements for the 140 nm trenches were made on a Hitachi CG 4000 SEM, and the presence and relative amount of scum was visually examined using images produced with the SEM at 20 mJ/$cm^2$. The relative amount of observed scum was categorized on a scale from least to greatest as follows: no scum (absence of visually detected scum)<slight scum<moderate scum<heavy scum. The presence of heavy scum was observed on the formed resist-patterned wafer.

Examples 8-13

A 600 Å thick layer of the descumming composition of each of Examples 1-6 was spin-coated over a respective patterned wafer formed in Example 8 using a TEL Clean Track. The wafers were baked at 70° C. for 60 seconds, rinsed in a 2.38% TMAH developer rinsing agent for 30 seconds and rinsed with water, on the Clean Track. Critical dimension (CD) measurements for the 140 nm trenches were made on a Hitachi CG 4000 SEM and the presence and amount of scum was examined at 20 mJ/$cm^2$. The results are set forth in Table 1.

TABLE 1

| Example | Descumming Composition | CD (nm) at 20 mj/cm2 | Scum of 140 nm trench 1:1 |
|---|---|---|---|
| 7 (Comp) | — | 123 | Heavy Scum |
| 8 | Ex. 1 | 138 | No scum |
| 9 | Ex. 2 | 135 | No scum |
| 10 | Ex. 3 | 134 | No scum |
| 11 | Ex. 4 | 140 | No scum |
| 12 | Ex. 5 | 137 | No scum |
| 13 | Ex. 6 | 137 | No scum |

Ion Implantation

Example 9

The wafers of Examples 9-15 are ion implanted with $B^{11}$ ($10^{14}$ atoms/$cm^2$, 40 keV) using a $BF_3$ source.

What is claimed is:

1. A method of forming an ion implanted region in a semiconductor device, comprising:

(a) providing a semiconductor substrate having a plurality of regions to be ion implanted;

(b) forming a photoresist pattern on the semiconductor substrate, wherein the photoresist pattern is formed from a chemically amplified photoresist composition comprising a matrix polymer having acid labile groups, a photoacid generator and a solvent;

(c) coating a descumming composition over the photoresist pattern, wherein the descumming composition comprises a mixture of: a matrix polymer; a free acid; and a solvent;

(d) heating the coated semiconductor substrate;

(e) contacting the coated semiconductor substrate with a rinsing agent to remove residual descumming composition and scum from the substrate; and (f) ion implanting the plurality of regions of the semiconductor substrate using the photoresist pattern as an implant mask.

2. The method of claim 1, wherein the free acid is an aromatic acid.

3. The method of claim 1, wherein the free acid is a non-aromatic acid.

4. The method of claim 1, wherein the solvent of the descumming composition comprises an organic solvent.

5. The method of claim 1, wherein the descumming composition is an aqueous solution.

6. The method of claim 1, wherein the rinsing agent comprises water or an aqueous alkaline solution.

7. The method of claim 1, wherein the rinsing agent comprises an organic solvent or solvent mixture.

8. The method of claim 7, wherein the rinsing agent further comprises water.

9. The method of claim 1, wherein the matrix polymer of the descumming composition comprises functional groups chosen from —OH, —COOH, —$SO_3H$, —SiOH, hydroxyl styrene, hydroxyl naphthalene, sulfonamide, hexafluoroisopropyl alcohol, anhydrate, lactone, ester, ether, allylamine, pyrolidone and combinations thereof.

10. The method of claim 1, wherein forming the photoresist pattern comprises coating a layer of the photoresist composition over a developable bottom antireflective layer that is exposed and developed simultaneously with the photoresist pattern.

11. The method of claim 2, wherein the aromatic acid contains fluorine.

12. The method of claim 11, wherein the aromatic acid is chosen from one or more of the following acids:

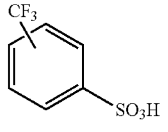

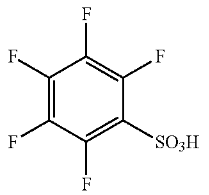

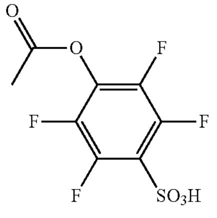

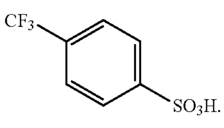

13. The method of claim 3, wherein the non-aromatic acid has at least one fluorine substituent at the alpha position of the acid group.

14. The method of claim 1, wherein the free acid is a sulfonic acid.

15. The method of claim 1, wherein the matrix polymer is free of functional groups chosen from —COOH, —$SO_3H$ and combinations thereof.

16. The method of claim 1, wherein the free acid is chosen from those of the following formula (I):

$$R^0ASO_3H \quad \text{(I)}$$

wherein: $R^0$ is a linear, branched or cyclic alkyl group having from 1 to 30 carbon atoms, optionally substituted with a fluorine atom or hydroxy group; and A is a single bond, an ether group, a thioether group, a carbonyl group, an ester group, an amido group, a sulfonamido group, a urethane group, a urea group, an alkylene group optionally substituted with a fluorine atom or hydroxy group, or a combination thereof.

17. The method of claim 1, wherein the free acid is chosen from those of the following formula (II):

(II)

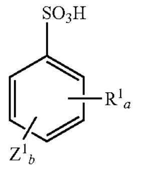

wherein: $R^1$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^1$ independently represents a group chosen from carboxyl, hydroxy, nitro, cyano, C1 to C5 alkoxy, formyl and sulfonic acid; a and b are independently an integer from 0 to 5; and a+b is 5 or less.

18. The method of claim 1, wherein the free acid is chosen from those of the following formula (III), (IV), (V), (VI) and (VI):

(III)

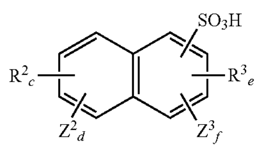

wherein: $R^2$ and $R^3$ each independently represents a substituted or unsubstituted C1-C20 alkyl group, a substituted or unsubstituted C5-C16 aryl group or a combination thereof, optionally containing one or more group chosen from carbonyl, carbonyloxy, sulfonamido, ether, thioether, a substituted or unsubstituted alkylene group, or a combination thereof; $Z^2$ and $Z^3$ each independently represents a group chosen from carboxyl, hydroxy, nitro, cyano, C1 to C5 alkoxy, formyl and sulfonic acid; c and d are independently an integer from 0 to 4; c+d is 4 or less; e and f are independently an integer from 0 to 3; and e+f is 3 or less;

(IV)

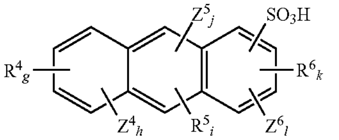

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 2; i+j is 2 or less; k and l are independently an integer from 0 to 3; and k+lis 3 or less;

(V)

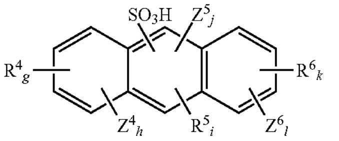

wherein: $R^4$, $R^5$ and $R^6$ each independently represents a substituted or unsubstituted C1-C20 alkyl group, a substituted or unsubstituted C5-C12 aryl group or a combination thereof, optionally containing one or more group chosen from carbonyl, carbonyloxy, sulfonamido, ether, thioether, a substituted or unsubstituted alkylene group, or a combination thereof; $Z^4$, $Z^5$ and $Z^6$ each independently represents a group chosen from carboxyl, hydroxy, nitro, cyano, C1 to C5 alkoxy, formyl and sulfonic acid; g and h are independently an integer from 0 to 4; g+h is 4 or less; i and j are independently an integer from 0 to 1; i+j is 1or less; k and l are independently an integer from 0 to 4; and k+l is 4 or less;

(VI)

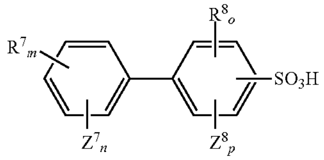

wherein: $R^7$ and $R^8$ each independently represents a substituted or unsubstituted C1-C20 alkyl group, a substituted or unsubstituted C5-C14 aryl group or a combination thereof, optionally containing one or more group chosen from carbonyl, carbonyloxy, sulfonamido, ether, thioether, a substituted or unsubstituted alkylene group, or a combination thereof; $Z^7$ and $Z^8$ each independently represents a group chosen from carboxyl, hydroxy, nitro, cyano, C1 to C5 alkoxy, formyl and sulfonic acid; m and n are independently an integer from 0 to 5; m+n is 5 or less; 0 and p are independently an integer from 0 to 4; and o+p is 4 or less; and (VII)

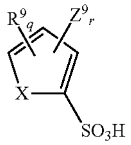

wherein: X is O or S; $R^9$ independently represents a substituted or unsubstituted C1-C20 alkyl group, a substituted or unsubstituted C5-C20 aryl group or a combination thereof, optionally containing one or more group chosen from carbonyl, carbonyloxy, sulfonamido, ether, thioether, a substituted or unsubstituted alkylene group, or a combination thereof; $Z^9$ independently represents a group chosen from carboxyl, hydroxy, nitro, cyano, C1 to C5 alkoxy, formyl and sulfonic acid; q and r are independently an integer from 0 to 3; and q+r is 3 or less; and wherein $R^1$—$R^9$ optionally form a fused structure together with their respective associated rings.

* * * * *